(12) United States Patent
Haehn et al.

(10) Patent No.: US 11,502,008 B2
(45) Date of Patent: Nov. 15, 2022

(54) DUAL STRIP BACKSIDE METALLIZATION FOR IMPROVED ALT-FLI PLATING, KOZ MINIMIZATION, TEST ENHANCEMENT AND WARPAGE CONTROL

(71) Applicant: Intel Corporation, Santa Clara, CA (US)

(72) Inventors: Nicholas S. Haehn, Scottsdale, AZ (US); Edvin Cetegen, Chandler, AZ (US); Shankar Devasenathipathy, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 64 days.

(21) Appl. No.: 16/612,618

(22) PCT Filed: Jun. 30, 2017

(86) PCT No.: PCT/US2017/040307
§ 371 (c)(1),
(2) Date: Nov. 11, 2019

(87) PCT Pub. No.: WO2019/005110
PCT Pub. Date: Jan. 3, 2019

(65) Prior Publication Data
US 2020/0203240 A1    Jun. 25, 2020

(51) Int. Cl.
*H01L 25/065* (2006.01)
*H01L 21/48* (2006.01)
(Continued)

(52) U.S. Cl.
CPC .......... *H01L 23/10* (2013.01); *H01L 21/4846* (2013.01); *H01L 23/538* (2013.01);
(Continued)

(58) Field of Classification Search
CPC ....... H01L 23/10; H01L 23/53; H01L 23/538; H01L 23/58; H01L 23/585; H01L 24/13;
(Continued)

(56) References Cited

U.S. PATENT DOCUMENTS 5,841,191 A    11/1998  Chia et al.
2004/0036179 A1    2/2004  Chiu et al.
(Continued)

OTHER PUBLICATIONS

International Preliminary Report on Patentability for International Patent Application No. PCT/US2017/040307, dated Jan. 9, 2020, 8 pages.
(Continued)

*Primary Examiner* — Monica D Harrison
(74) *Attorney, Agent, or Firm* — Schwabe, Williamson & Wyatt, P.C.

(57) ABSTRACT

An integrated circuit assembly including a substrate having a surface including at least one area including contact points operable for connection with an integrated circuit die; and at least one ring surrounding the at least one area, the at least one ring including an electrically conductive material. A method of forming an integrated circuit assembly including forming a plurality of electrically conductive rings around a periphery of a die area of a substrate selected for attachment of at least one integrated circuit die, wherein the plurality of rings are formed one inside the other; and forming a plurality of contact points in the die area.

13 Claims, 4 Drawing Sheets

(51) Int. Cl.
  *H01L 23/10* (2006.01)
  *H01L 23/538* (2006.01)
  *H01L 23/58* (2006.01)
  *H01L 23/00* (2006.01)

(52) U.S. Cl.
  CPC ............ *H01L 23/585* (2013.01); *H01L 24/13* (2013.01); *H01L 25/0655* (2013.01); *H01L 2224/13147* (2013.01)

(58) Field of Classification Search
  CPC ... H01L 21/48; H01L 21/484; H01L 21/4846; H01L 2224/13147; H01L 25/06; H01L 25/065; H01L 25/0655
  USPC ........................................................ 257/686
  See application file for complete search history.

(56) References Cited

U.S. PATENT DOCUMENTS

| | | |
|---|---|---|
| 2007/0246823 A1 | 10/2007 | Haga et al. |
| 2010/0013065 A1 | 1/2010 | Mistry et al. |
| 2010/0123219 A1* | 5/2010 | Chen .................... B23K 26/364 257/620 |
| 2011/0233736 A1 | 9/2011 | Park et al. |
| 2014/0231979 A1* | 8/2014 | Ziglioli ............... B81C 1/00301 257/686 |
| 2018/0151528 A1* | 5/2018 | Tsai .................... H01L 25/0657 |
| 2018/0342466 A1* | 11/2018 | Lin ....................... H01L 23/367 |

OTHER PUBLICATIONS

International Search Report and Written Opinion for International Patent Application No. PCT/US2017/040307 dated Mar. 29, 2018, 11 pgs.

* cited by examiner

US 11,502,008 B2

DUAL STRIP BACKSIDE METALLIZATION FOR IMPROVED ALT-FLI PLATING, KOZ MINIMIZATION, TEST ENHANCEMENT AND WARPAGE CONTROL

CROSS-REFERENCE TO RELATED APPLICATION

This patent application is a U.S. National Phase Application under 35 U.S.C. § 371 of International Application No. PCT/US2017/040307, filed Jun. 30, 2017, entitled "DUAL STRIP BACKSIDE METALLIZATION FOR IMPROVED ALT-FLI PLATING, KOZ MINIMIZATION, TEST ENHANCEMENT AND WARPAGE CONTROL," which designates the United States of America, the entire disclosure of which is hereby incorporated by reference in its entirety and for all purposes.

BACKGROUND

Field

Integrated circuit packaging.

Description of Related Art

For a first level interconnect (FLI) of electroplated copper (e.g., copper contact points or bumps), there are a limited number of solutions to address current crowding at regions were high copper density features are surrounded by large areas that are electrically neutral. These include using special additives within the plating chemistry to suppress plating in regions. This solution has a limited capacity and also influences all regions on a package substrate panel equally which could produce undesirable outcomes.

DETAILED DESCRIPTION

An integrated circuit assembly is described, as is a method of forming an integrated circuit assembly. In one embodiment, the integrated circuit assembly includes a substrate (e.g., a package substrate) having a surface including at least one area including contact point operable for connection with an integrated circuit die and at least one ring surrounding at least one area. In one embodiment, at least one ring includes an electrically conductive material. The electrically conductive material may be similar to an electrically conductive material used for contact points to interconnect the integrated circuit die to the substrate a similar material as the FLI. In another embodiment, the least one ring includes a first ring and a second ring wherein the first ring is disposed within the second ring. A ring in this sense is meant to describe a structure or structures that surround the at least one integrated circuit die and not a particular shape. Thus, a ring shape of rectangular, other quadrilateral shape, oval or circular, is contemplated. The at least one ring feature (e.g., two rings) improves electroplating uniformity for FLI bumps; minimizes a capillary underfill keep out zone (KOZ) by allowing an underfill (e.g., epoxy) to pin at a top of an inner ring and/or fill a cavity between plated features; provides a protective structure to enable sealing during test conditions to enhance liquid thermal interface material (LTIM) removal; and reduces package warpage.

Figure 1:
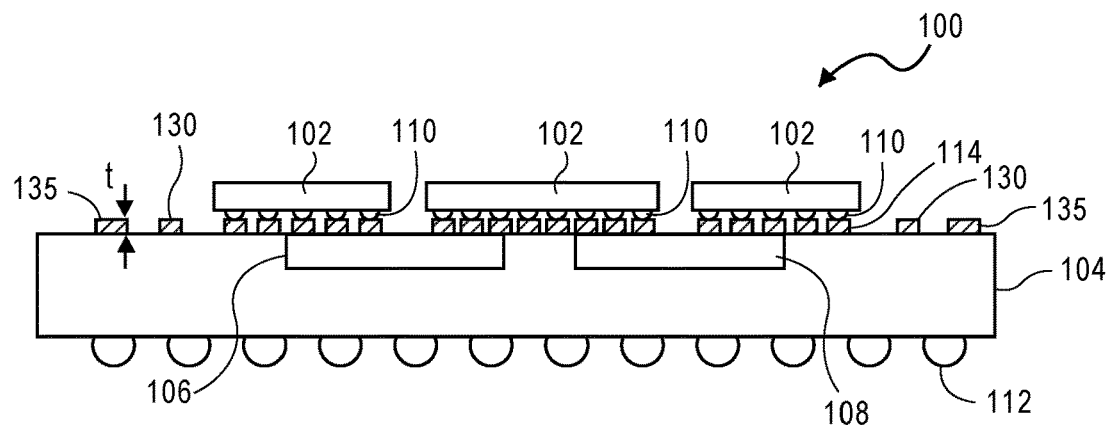
FIG. 1 schematically illustrates a cross-section side view of an embodiment of an integrated circuit (IC) package assembly including embedded bridge interconnect assemblies.

FIG. 1 schematically illustrates a cross-section side view of an embodiment of an integrated circuit (IC) package assembly 100 including embedded bridge interconnect assemblies (hereinafter "bridge 106" or "bridge 108"). It is appreciated that package assembly 100 is one type of package assembly for which the embodiments described herein are suitable. Package assembly 100 is one type of a multi-chip assembly. It is appreciated that the description herein is suitable for other multi-chip package assemblies as well as single chip package assemblies, whether or not such assemblies include an integrated heat spreader lid solution (not shown).

Referring to FIG. 1, in this embodiment, package assembly 100 includes package substrate 104 having a plurality (e.g., two or more) dies 102 mounted on a surface of package substrate 104 (a top surface as viewed). Package substrate 104, in one embodiment, includes an epoxy-based laminate substrate or body having a core and/or build-up layers such as, for example, an Ajinomoto Build-up Film (ABF) substrate. Package substrate 104 may include other suitable types of substrates in other embodiments.

Dies 102 may be, include, or be a part of a processor, memory, or application specific integrated circuit (ASIC) in some embodiments. Each of dies 102 may represent a discrete chip. Dies 102 can be attached to package substrate 104 according to a variety of suitable configurations including, a flip-chip configuration, as depicted, or other configurations such as wire bonding and the like. In the flip-chip configuration, an active side of dies 102 is attached to a surface of package substrate 104 (a top surface as viewed) using die interconnect structures 110 such as bumps.

Die interconnect structures 110 may be configured to route electrical signals between dies 102 and package substrate 104. In some embodiments, die interconnect structures 110 may be configured to route electrical signals such as, for example, input/output (I/O) signals and/or power or ground signals associated with the operation of dies 102.

Package substrate 104 includes electrical routing features configured to route electrical signals to or from the dies 102. The electrical routing features may be internal and/or external to bridge 106 or 108. In one embodiment, package substrate 104 includes electrical routing features such as external contact points (e.g., bumps or pillars) configured to receive die interconnect structures 110 and route electrical signals to or from dies 102. FIG. 1 shows first level interconnects (FLI) or contact points 114 associated with bridge 106 or bridge 108 (e.g., vias and traces to or from bridge 106 and bridge 108 are connected to contact points 114). In one embodiment, contact points 114 are configured to route input/output (I/O) signals between dies 102 and bridge 106 and bridge 108. Other contact points associated with the body of package substrate 104 may be configured to route power and ground signals between package substrate 104 and dies 102. Package substrate 104 further includes package level interconnects 112 such as, for example, solder balls, connected to a surface of the package substrate 104 (a backside surface as viewed) to further route electrical signals to other electrical devices (e.g., motherboard or other chipset).

Dies 102 are electrically connected to bridge 106 or 108 through an electrically conductive connection between ones of die interconnect structures 110 and contact points 114. In one embodiment, bridge 106 or 108 is configured to route electrical signals between the dies 102. Bridge 106 or 108 may be a dense interconnect structure that provides a route for electrical signals such as I/O signals. Bridge 106 or 108 may include a bridge substrate composed of glass or a semiconductor material (e.g., high resistivity silicon) having electrical routing features formed thereon to provide a chip-to-chip connection between dies 102. Bridge 106 or 108 may be composed of other suitable materials in other embodiments. Bridges 106, 108, in one embodiment, are embedded in a cavity or cavities of package substrate 104. In some embodiments, a portion of dies 102 may overly the embedded bridge 106 or 108.

Package assembly 100 in FIG. 1 also include first ring 130 and second ring 135 on a surface of package substrate 104 (a top surface as viewed) surrounding dies 102. First ring 130 is disposed within second ring 135. In one embodiment, each of first ring 130 and second ring 135 are a similar material, such as an electrically conductive material. In one embodiment, first ring 130 and second ring 135 are a material similar to a material of contact points 114. Where contact points 114 are copper pillars, first ring 130 and second ring 135 are a similar copper material. In one embodiment, first ring 130 and second ring 135 have a thickness, t, on the order of the thickness of contact points 114. A representative thickness, t, is on the order of 15 microns to 20 microns.

Figure 2:
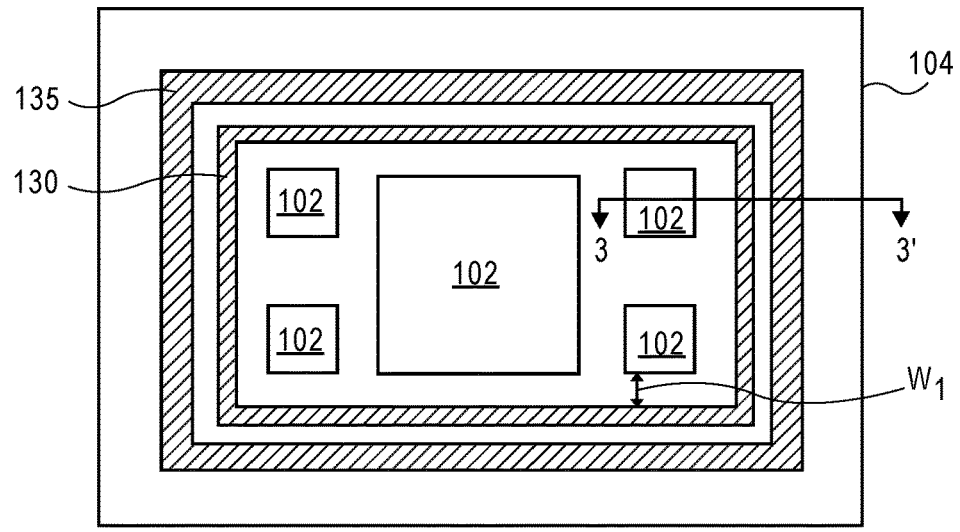
FIG. 2 shows a top view of an embodiment of the structure of FIG. 1.
Figure 3:
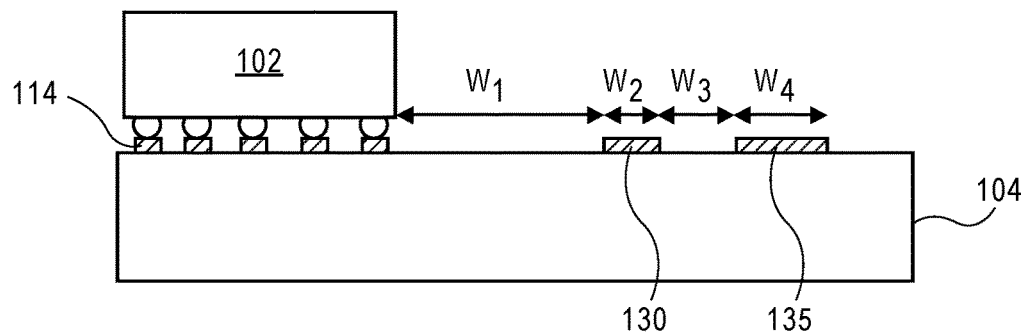
FIG. 3 shows a cross-section of the structure of FIG. 2 through lines 3-3'.

FIG. 2 shows a top view of an embodiment of the structure of FIG. 1. FIG. 3 shows a cross-section of the structure of FIG. 2 through lines 3-3'. In this embodiment, package assembly includes package substrate 104 and five dies 102 electrically connected to a top surface thereof. Surrounding dies 102 are first ring 130 and second ring 135, with first ring 130 within the area surrounded by second ring 135. In this embodiment, first ring 130 and second ring 135 have a generally rectangular shape. It is appreciated that first ring 130 and second ring 135 may adopt other shapes (e.g., other quadrilateral shapes). A rectangular shape is representative. In one embodiment, a distance, $w_1$, from an edge of one of dies 102 to first ring 130 and a thickness of the individual rings ($w_2$ for first ring 130 and $w_4$ for second ring 135) are selected to improve a plating uniformity of contact points 114 (e.g., bumps or pillars) on package substrate 104. A representative distance, $w_1$, is on the order of 1 millimeter (mm) to 3 mm, such as 2 mm. A representative collective thickness of first ring 130 and second ring 135 ($w_2+w_4$) is 400 µm to 600 µm, such as 500 µm.

Figure 4:
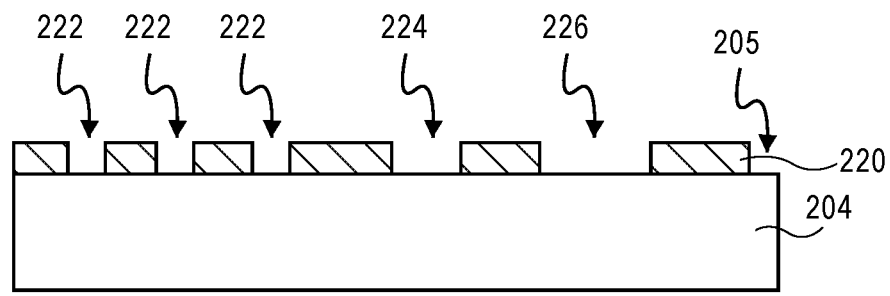
FIG. 4 shows the package substrate having a surface designated for a die (dies) attachment.
Figure 5:
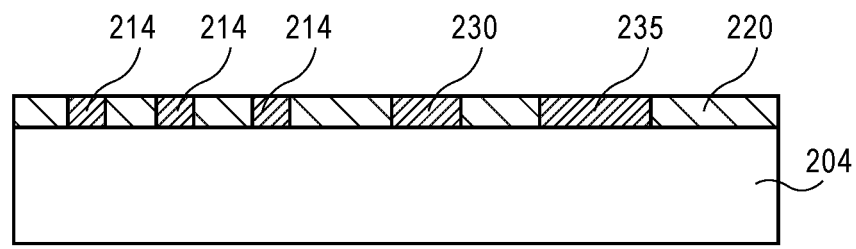
FIG. 5 shows the structure of FIG. 4 following the deposition of an electrically conductive material in the openings in the masking material on the substrate.
Figure 6:
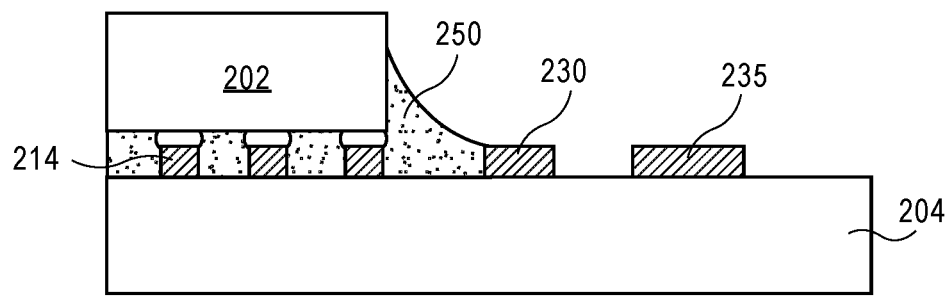
FIG. 6 shows the structure of FIG. 5 following the removal of the masking material, the attachment of a die to the package substrate and the deposition of underfill material around the die.

FIGS. 4-6 describe a process of forming a package substrate including two ring features surrounding first level interconnects (e.g., bumps). Referring to FIG. 4, the figure shows package substrate 204 having surface 205 designated for die (dies) attachment. Disposed on surface 205 of package substrate 204 is masking material 220. A representative material for masking material 220 is dry film resist. In this embodiment, masking material 220 is patterned to have openings to expose surface 205 for contact points (openings 222), a first ring feature (opening 224) and a second ring feature (opening 226). FIG. 5 shows the structure of FIG. 4 following the deposition of an electrically conductive material in the openings in the masking material on the substrate. In one embodiment, the electrically conductive material is copper that is deposited by an electrodeposition process. According to one process, a seed material is initially deposited in openings 222, 224 and 226. This is followed by an electroplating process to deposit copper in openings 222, 224 and 226. The plating of the first level interconnects (e.g., bumps) is done at the same time as the plating of the first ring and the second ring. FIG. 5 shows contact points 214 (e.g., bumps), first ring 230 and second ring 235. The plating of the ring features at the same time as contact points 214 (first level interconnects) reduces an area around the contact points that is electrically neutral. The reduced area of electrical neutrality during electroplating tends to improve the plating uniformity of contact points 214. Without wishing to be bound by theory, the ring features act as current thieves drawing current away from an area of contact points 214 during the plating process to otherwise neutral areas (absent the presence of the ring features). Thus, the presence of the ring features tends to improve the uniformity of the plated contact points (e.g., improve bump height uniformity).

FIG. 6 shows the structure of FIG. 5 following the removal of masking material 220, the attachment of die 202 to the package substrate and the deposition of underfill material around the die. Following the deposition of contact points 214, first ring 230 and second ring 235, masking material 220 is removed such as by chemical means (e.g., a chemical stripper). Following the removal of masking material 220, die 202 is attached to contact points 214. It is appreciated that die 202 may be the only die attached to package substrate 204 or one of multiple dies attached to the package substrate. In an embodiment where there are multiple dies, each of the multiple dies is within a boundary defined by first ring 230.

Following the attachment of die 202 to package substrate 204, an underfill material is introduced under and around die 202. In one embodiment, a suitable underfill material is a flowable epoxy that may or may not have a filler (e.g., a silicon dioxide filler). Underfill material 250 is dispensed between die 202 and package substrate 204, for example, by needle or jetting techniques. In one embodiment, the presence of first ring 230 and second ring 235 serves to limit the spread of underfill material 250 following its deposition (limiting a size of a keep out zone (KOZ)). FIG. 6 shows first ring 230 acting as a damn to stop the flow of underflow material 250 beyond a boundary defined by the ring. By limiting the spread of underfill material 250 across a surface of package substrate 204, a capillary underfill KOZ is reduced and additional area on surface 205 of package substrate 204 is possibly available for attachment of other devices or other uses. An area between first ring 230 and second ring 235 can also serve as a reservoir for excess material, further decreasing a sensitivity of a dispense amount of underfill material 250. The reduced sensitivity can shorten a time delay for finished product or new products.

A single chip or multi-chip package may be tested. One test for unlidded packages (a package without heat spreader solution attached as a lid thereto) introduces a liquid thermal interface material (LTIM) or deionized water around the die.

Figure 7:
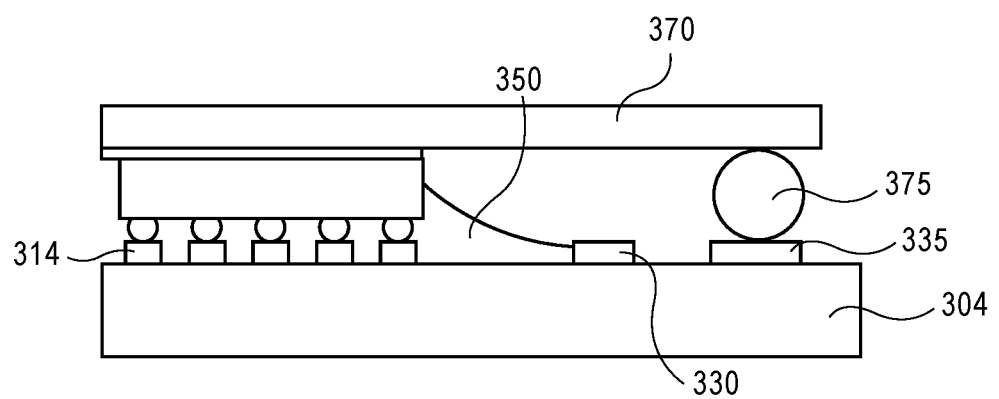
FIG. 7 shows a representative cross-sectional side view of a portion of a package substrate having a tester thereon.

The area around the die is sealed to contain the LTIM or deionized water and allow testing of the environment. Once the testing is complete, the LTIM or deionized water is removed. The inclusion of at least one ring feature on a surface of a package substrate provides a surface for a tester to seal against. Such a seal provides an ability to generate a pressure differential between the ambient and within the tester to allow a rapid removal of LTIM or deionized water after the test. FIG. 7 shows a representative cross-sectional side view of a portion of a package substrate having a tester thereon. FIG. 7 shows package substrate 304 including die 302 connected to contact points 314 (e.g., bumps) on a surface of package substrate 304 and first ring 330 and second ring 335 surrounding die 302. FIG. 7 also shows underfill material 350 around die 302. FIG. 7 further shows tester 370 disposed on the package. Tester is coupled to package substrate by seal 375 between the tester and second ring 335. Second ring 335 provides a relatively flat, generally clean surface for attachment of a seal. In one embodiment, seal 375 is a removable material suitable to bind or adhere to second ring 335 and allow a pressure differential to be established on opposite sides of the seal. A suitable material for seal 375 is an elastomeric material. In one embodiment, an LTIM or water is introduced between tester 370 and a surface of the package. Following testing, the LTIM or water is removed. Because seal 375 is able to attach to second ring 335 and establish a consistent and clean seal, a pressure gradient may be established on opposite sides of seal 375 to rapidly remove the LTIM or water though, for example, a vacuum port of tester 370. This results in a rapid, more complete LTIM or deionized water removal from the die surface than prior art attempts.

Finally, the presence of at least one ring feature, such as a first ring and second ring on a package substrate as described above incorporates a stiffness control into the substrate manufacturing process during an existing processing operation (the forming of FLI). Therefore, there is no added time or costs (beyond the marginal cost of a material for the ring features). The presence of the second ring feature also increases the area moment of inertia with respect to an equivalent single-ring design for a similar width feature, thereby increasing the stiffness and resistance of a package to bending and warping.

Figure 8:
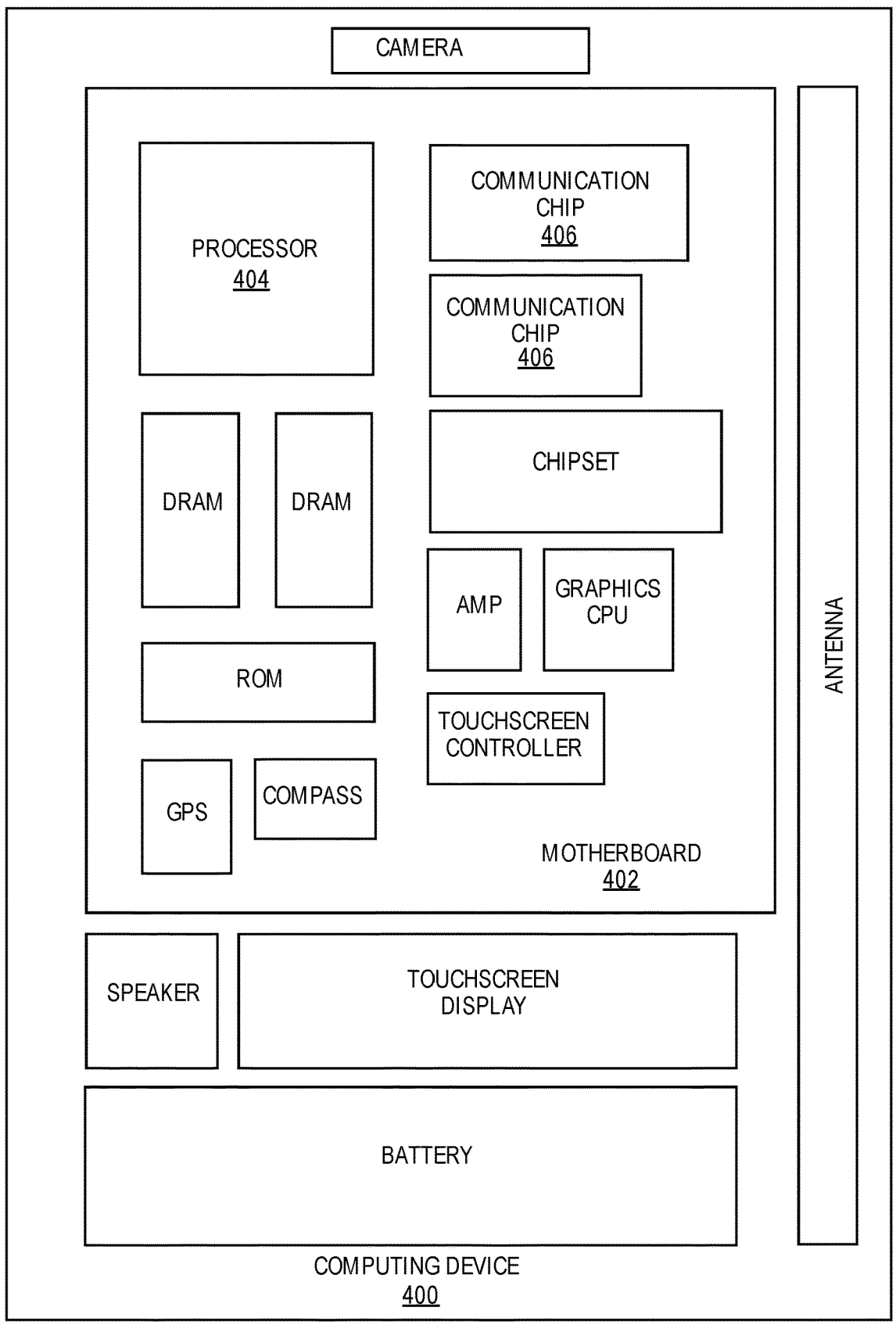
FIG. 8 illustrates an embodiment of a computing device.

FIG. 8 illustrates computing device 400 in accordance with one implementation. Computing device 400 houses board 402. Board 402 may include a number of components, including but not limited to processor 404 and at least one communication chip 406. Processor 404 is physically and electrically coupled to board 402. In some implementations at least one communication chip 406 is also physically and electrically coupled to board 402. In further implementations, communication chip 406 is part of processor 404.

Depending on its applications, computing device 400 may include other components that may or may not be physically and electrically coupled to board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, first communication chip 406 may be dedicated to shorter range wireless communications such as Wi-Fi and Bluetooth and second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. In some implementations, the integrated circuit die of the processor includes one or more devices, such as transistors or metal interconnects. A package may include a package substrate including one or more rings surrounding the integrated circuit die as described above. The term "processor" may refer to any device or portion of a device that processes electronic data from registers and/or memory to transform that electronic data into other electronic data that may be stored in registers and/or memory.

Communication chip 406 also includes an integrated circuit die packaged within communication chip 406. In accordance with another implementation, the integrated circuit die of the communication chip includes one or more devices, such as transistors or metal interconnects. A package may include a package substrate including one or more rings surrounding the integrated circuit die as described above.

In further implementations, another component housed within computing device 400 may contain an integrated circuit die that includes one or more devices, such as transistors or metal interconnects.

In various implementations, computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

EXAMPLES

Example 1 is an integrated circuit assembly including a substrate having a surface including at least one area including contact points operable for connection with an integrated circuit die; and at least one ring surrounding the at least one area, the at least one ring including an electrically conductive material.

In Example 2, the at least one ring of the assembly of Example 1 includes a first ring and a second ring, wherein the first ring is disposed within the second ring.

In Example 3, the electrically conductive material of the first ring and of the second ring of the assembly of Example 2 is the same as a material of the contact points.

In Example 4, the electrically conductive material of the assembly of Example 3 is copper.

In Example 5, the contact points of the assembly of Example 4 include plated bumps.

In Example 6, the first ring and the second ring of the assembly of Example 4 have a thickness equivalent to a thickness of the plated bumps.

In Example 7, the first ring of the assembly of Example 6 has a width dimension that is less than a width dimension of the second ring.

In Example 8, the at least one area of the surface of the substrate of the assembly of Example 2 includes a plurality of areas.

In Example 9, the assembly of Example 1 further includes a die coupled to the at least one area of the surface of the substrate.

In Example 10, the contact points of the assembly Example 9 include plated bumps and a distance from an edge of the die and a nearest point on the at least one ring is selected to effect a uniformity of the plated bumps.

Example 11 is an integrated circuit assembly including a first die coupled to a first area of a surface of a substrate and a second die coupled to a second area of the surface; and at least one ring coupled to the substrate and surrounding each of the first die and the second die.

In Example 12, the at least one ring of the assembly Example 11 includes a first ring and a second ring, wherein the first ring is disposed within the second ring.

In Example 13, the first die and the second die of the assembly Example 12 are each coupled to contact points on the substrate, wherein a material of the contact points is similar to a material of the first ring and the second ring.

In Example 14, the material of the assembly Example 13 is copper.

In Example 15, the contact points of the assembly Example 14 include plated bumps.

In Example 16, a thickness of the first ring and a thickness of the second ring of the assembly Example 15 is similar to a thickness of the plated bumps.

In Example 17, a width of the first ring of the assembly Example 16 is less than a width of the second ring.

Example 18 is a method of forming an integrated circuit assembly including forming a plurality of electrically conductive rings around a periphery of a die area of a substrate selected for attachment of at least one integrated circuit die, wherein the plurality of rings are formed one inside the other; and forming a plurality of contact points in the die area.

In Example 19, the plurality of electrically conductive rings and the plurality of contact points in the method of Example 18 are formed in a similar process operation.

In Example 20, a material of the plurality of electrically conductive rings and a material of the plurality of contact points in the method of Example 19 is copper.

In Example 21, the process operation in the method of Example 19 includes an electroplating operation.

In Example 22, after forming the plurality of electrically conductive rings and the plurality of contact points in the method of any of Examples 18-21, connecting at least one die to the plurality of contact points.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made to the invention in light of the above detailed description. The terms used in the following claims should not be construed to limit the invention to the specific implementations disclosed in the specification and the claims. Rather, the scope is to be determined entirely by the following claims, which are to be construed in accordance with established doctrines of claim interpretation.

The invention claimed is:

1. An integrated circuit assembly comprising:
   a substrate having a surface comprising at least one area comprising contact points, wherein the contact points have a first height;
   a die coupled to the at least one area of the surface of the substrate, the die having an uppermost surface; and
   a first ring and a second ring surrounding the at least one area, the second ring surrounding the first ring, and the first ring and the second ring comprising an electrically conductive material, wherein the first ring and the second ring have a second height, the second height the same as the first height, wherein a lateral thickness of the conductive material of the second ring is greater than a lateral thickness of the conductive material of the first ring, and wherein the first ring and the second ring each have an uppermost surface below the uppermost surface of the die.

2. The assembly of claim 1, wherein the electrically conductive material of the first ring and of the second ring is the same as a material of the contact points.

3. The assembly of claim 2, wherein the electrically conductive material is copper.

4. The assembly of claim 3, wherein the contact points comprise plated bumps.

5. The assembly of claim 1, wherein the at least one area of the surface of the substrate comprises a plurality of areas.

6. The assembly of claim 1, wherein the contact points comprise plated bumps and a distance from an edge of the die and a nearest point on the at least one ring is selected to effect a uniformity of the plated bumps.

7. An integrated circuit assembly comprising:
   a first die coupled to a first area of a surface of a substrate and a second die coupled to a second area of the surface, wherein the first die and the second die are each coupled to contact points on the substrate, and wherein the contact points have a first height, the first die having an uppermost surface, and the second die having an uppermost surface; and
   a first ring and a second ring coupled to the substrate and surrounding each of the first die and the second die, the second ring surrounding the first ring, and the first ring and the second ring comprising an electrically conductive material, wherein the first ring and the second ring have a second height, the second height the same as the first height, wherein a lateral thickness of the conductive material of the second ring is greater than a lateral thickness of the conductive material of the first ring, and wherein the first ring and the second ring each have an uppermost surface below the uppermost surface of first die and below the uppermost surface of second die.

8. The assembly of claim 7, wherein a material of the contact points is similar to the electrically conductive material of the first ring and the second ring.

9. The assembly of claim 8, wherein the material is copper.

10. The assembly of claim 9, wherein the contact points comprise plated bumps.

11. A method of forming an integrated circuit assembly comprising:

forming a plurality of electrically conductive rings around a periphery of a die area of a substrate, wherein the plurality of electrically conductive rings has a first height and comprises an electrically conductive material, wherein the plurality of electrically conductive rings comprises a first ring and a second ring, the second ring surrounding the first ring, and wherein a lateral thickness of the conductive material of the second ring is greater than a lateral thickness of the conductive material of the first ring;

forming a plurality of contact points in the die area, wherein the plurality of contact points have a second height, the second height the same as the first height, and coupling a die to the die area of the substrate, the die having an uppermost surface, wherein the first ring and the second ring each have an uppermost surface below the uppermost surface of the die.

12. The method of claim 11, wherein the plurality of electrically conductive rings and the plurality of contact points are formed in a similar process operation.

13. The method of claim 12, wherein the electrically conductive material of the plurality of electrically conductive rings and a material of the plurality of contact points is copper.

\* \* \* \* \*